United States Patent
Wu

(10) Patent No.: US 6,395,592 B1
(45) Date of Patent: May 28, 2002

(54) METHODS FOR FABRICATING SCALABLE NON-VOLATILE SEMICONDUCTOR MEMORY DEVICE WITH DOUBLE-SIDES ERASE CATHODES

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 0 days.

(21) Appl. No.: 09/695,479

(22) Filed: Oct. 24, 2000

(51) Int. Cl.$^7$ .......................................... H01L 21/8238
(52) U.S. Cl. ....................................................... 438/201
(58) Field of Search ................................. 438/201, 207, 438/211, 218, 230, 431, 443, 445, 447, 453

(56) References Cited

U.S. PATENT DOCUMENTS 5,196,367 A  * 3/1993 Lu et al. ........................ 437/70
5,898,960 A  * 11/1999 Fukase ........................ 438/267
6,166,409 A  * 12/2000 Ratnam et al. ............. 257/316

\* cited by examiner

*Primary Examiner*—David Nelms
*Assistant Examiner*—Quoc Hoang
(74) *Attorney, Agent, or Firm*—Powell, Goldstein, Frazer & Murphy LLP

(57) ABSTRACT

Non-volatile semiconductor memory device for high-density and high-speed mass storage applications is described, in which a method for simultaneously fabricating field-oxide isolation and floating gate of non-volatile semiconductor memory device having high coupling ratio and embedded double-sides erase cathodes and a method for fabricating scalable split-gate non-volatile semiconductor memory device are disclosed. The field-oxide isolation is obtained by a special multilayer oxidation masking structure of the present invention, in which the field-doping encroachment and the bird's beak extension into the active regions of the minimum feature size can be eliminated and the smaller isolation area occupied together with the embedded double-sides erase cathodes are prepared for fabricating scalable split-gate non-volatile semiconductor memory device of the present invention. The scalable split-gate non-volatile semiconductor memory device is fabricated without the lithographic limitation encountered by the prior art, in which the channel length of control-gate device and floating-gate device can be separately tailored by a special spacer formation technique to have a dimension much smaller than the minimum feature size of technology used. Therefore, the whole channel length of split-gate non-volatile semiconductor memory device of the present invention can be made to be smaller than the minimum feature size of technology used and the major disadvantages of the conventional split-gate non-volatile semiconductor memory device are removed by the present invention. Moreover, the self-aligned silicidation is performed to the gate/the control gate, the source/the common buried source, and the drain/the common buried drain of devices to reduce the contact and interconnect resistances, and the self-aligned contacts are performed by using the silicon-nitride spacers formed on the sidewalls of devices to reduce the space of contacts. As a result, the present invention is suitable to fabricate high-density and high-speed split-gate non-volatile semiconductor memory system for mass storage applications.

42 Claims, 6 Drawing Sheets

METHODS FOR FABRICATING SCALABLE NON-VOLATILE SEMICONDUCTOR MEMORY DEVICE WITH DOUBLE-SIDES ERASE CATHODES

BACKGROUND OF THE INVENTION

1. Field of the Invention

The invention relates generally to non-volatile semiconductor memory devices and more particularly to very high-density and high-speed split-gate non-volatile semiconductor memory devices.

2. Description of Related Art

Non-volatile semiconductor memory devices are known to store charges in an isolated gate (so called the floating gate) by means of either Fowler-Nordheim tunneling or hot-carrier injection through a thin insulator layer from the semiconductor substrate and to remove (so called erase) charges stored in an isolated gate by means of either Fowler-Nordheim tunneling or ultra-violet light through a thin insulator layer to the semiconductor substrate or another gate (so called the control gate or the erase gate) Aside from EPROMS using ultra-violet light for erase, almost all other non-volatile semiconductor memory devices are electrically erasable. The term "flash" in general refers to the ability to rapidly erase the stored charges with electrical pulses by means of Fowler-Nordheim tunneling. Basically, the cell size is a major concern for high-density mass storage applications and the device structure must be developed toward high program and erase efficiency with high reliability. The program,erase and read efficiency is mainly evaluated by voltage, current and time, and smaller in magnitude means better efficiency. Higher reliability implies higher endurance and higher retention; higher endurance means larger program and erase times ($\geq 10^5$) and higher retention means less stored-charges leakage due to any possible disturbs.

Based on the device structure, the prior arts can be basically divided into two catagories: stack-gate structure and split-gate structure. FIG. 1 shows a typical structure of the conventional stack-gate non-volatile memory devices and FIG. 2 shows a typical structure of the conventional split-gate non-volatile memory devices. The stack-gate non-volatile memory device shown in FIG. 1 includes a p-type substrate 100, and an n$^+$-type source diffusion region 101 provided in the p-type substrate 100, and the double-diffused drain having a n$^-$-type drain diffusion region 102 and a n$^+$-type drain diffusion region 103 inserted in a n$^-$-type drain diffusion region 102. A thin tunneling-oxide layer 104 is provided on the surface of the p-type substrate 100 having a thickness of approximately 100 Angstroms. A polycrystalline-silicon layer 105 acted as the floating gate is provided on the thin tunneling-oxide layer 104, and an inter-gate dielectric layer 106 using the ONO layer separates the floating gate 105 and the control gate 107 using the polycide layer.

The programming of this stack-gate non-volatile memory device shown in FIG. 1 is accomplished by applying a relatively high positive voltage of approximately 12 volts to the control gate and a moderately high voltage of approximately 9 volts to the source of the cell, and the drain is grounded. In general, the device is operated in saturation region and the channel-modulation region near the source is used to generate hot carriers in which hot-electrons with energy higher than the interface barrier between the conduction bands of the tunneling oxide and the semiconductor substrate are injected into the floating gate and stored there, and the hot holes generated produce the substrate current. Since most of channel carriers are collected by the positive source voltage, the injection efficiency is poor. Moreover, the optimization of source and channel profiles is needed to increase the programming efficiency without producing the reliability problems.

The erasing of the stack-gate non-volatile memory device shown in FIG. 1 is accomplished by applying a relatively high positive voltage of approximately 12 volts to the drain while the control gate is grounded and the source is usually floating. The stored electrons in the floating gate are tunneling from the floating gate to the drain by high electric field across thin tunneling gate oxide over the double-diffused drain. The above erasing can be slightly modified by reducing the applied voltage across the drain and substrate junction from 12 volts to 5 volts or below while the control gate is applied with a moderately high negative voltage of approximately-9 volts. The reduction of the drain voltage is mainly used to eliminate the band-to-band tunneling effects which may produce the undesirable hot-hole injection or holes trapped in the gate oxide. Apparently, the erase efficiency is dependent on the applied electric field across the thin tunneling oxide and the erase area. The higher electric field across the tunneling oxide needs higher applied voltage between the control gate and the drain or thinner tunneling-oxide layer; the larger erase area needs deeper double-diffused depth to produce larger overlapping area for thin gate oxide or to include the substrate and the overlapped source diffusion region for erase. However, the erase of stored electrons from the floating gate to the overlapped drain/source/the substrate is not self-limiting, the overerase problem is inevitable. Therefore, an adaptive erase technique using complicated circuitry and software to perform a series of erase and verify steps is used to prevent overerasing cell shown in FIG. 1.

A typical split-gate non-volatile memory device shown in FIG. 2 includes a p-type substrate 110 and n$^+$-type source and drain diffusion regions 118, 117 provided in the p-type substrate 110. A thin tunneling-oxide layer 111 of approximately 100 Angstroms in thickness is formed on the surface of a portion of the p-type substrate 110 and a portion of n$^+$-type source diffusion region 118 under the polycrystalline-silicon floating gate 113. The floating gate 113 overlaps a portion of the source diffusion region 118 and a portion of the channel. A special shape of polycrystalline-silicon oxide 114 is formed on the polycrystalline-silicon floating gate 113 using the conventional LOCal-Oxidation of Silicon (LOCOS) technique. A dielectric layer 115 separates the sidewall of the polycrystalline-silicon floating gate 113 from the control gate 116, and a portion of the control gate 116 is formed on a thicker gate-oxide layer 112. The control-gate 116 overlaps a portion of the drain diffusion region 117 and a portion of the channel through a thicker gate-oxide layer 112. The conventional split-gate non-volatile memory device shown in FIG. 2 can be considered as two devices in series: one device is the floating-gate non-volatile memory transistor and the other device is a series enhancement-mode MOS transistor controlled by the control gate, and is recognized as 1.5 transistor device based on the lithographic point of view. Therefore, the prior art shown in FIG. 2 is not suitable for high-density mass-storage applications if the cost per bit is concerned. Moreover, the limitation of lithographic alignment tolerance of the control-gate results in another barrier for further device scaling.

The programming of the conventional split-gate non-volatile memory device shown in FIG. 2 is accomplished by applying a relatively low positive voltage of approximately 2 volts(threshold voltage of the control-gate MOS transistor) and a relatively high positive voltage of approximately 12 volts to the source of the cell, and the drain is grounded. The hot-carriers are generated by high lateral electric field under the gap between the floating gate and the control gate. The generated hot-electrons with energy higher than the interface barrier between the conduction bands of the silicon-oxide and the p-type substrate are injected into the floating gate and stored there, and the hot-holes generated produce the substrate current. Basically, the mechanism of the programming of the split-gate non-volatile memory device shown in FIG. 2 is similar to that of the stack-gate non-volatile memory device shown in FIG. 1. However, the channel current for programming which is controlled by the control gate is much smaller than that of the stack-gate non-volatile memory device shown in FIG. 1 and this is one of the advantages of the split-gate non-volatile memory device. The relatively high source voltage used is one of disadvantages as compared to that of the stack-gate non-volatile memory device, which is mainly due to 1.5 transistor used.

The erasing of the conventional split-gate non-volatile memory device shown in FIG. 2 is accomplished by applying a relatively high positive voltage of approximately 14 volts to the control gate while the source and the drain are grounded. The erasing is performed by using Fowler-Nordheim tunneling from the floating gate to the control gate through the side-wall injector along the edge of the floating gate and is self-limiting through the accumulation of positive charges on the injector of the floating gate. Therefore, the over-erasing doesn't occur for the split-gate non-volatile memory device shown in FIG. 2, the erasing circuitry is then much simpler than that of the stack-gate non-volatile memory device shown in FIG. 1. The relatively high erasing voltage used is one of the disadvantages and the smiling effect due to the oxidation of the sidewall of the polycrystalline-silicon floating gate must be eliminated to prevent the reverse tunneling disturb.

From the above description, the stack-gate structure can be easily scaled by using the lithographic technique, but the programming efficiency is poor and most of source current is wasted, the over-erase problem needs complicated circuitry; the split-gate structure exhibits larger cell size and cannot be easily scaled by the prior art, and higher applied voltages are needed for program and erase, but the programming efficiency is high and the source current is smaller, the erasing is self-limiting and complicated circuitry is not required.

It is, therefore, an objective of this invention to provide a scalable split-gate non-volatile memory device for high-density and high-speed mass storage applications to overcome the disadvantages of the conventional split-gate non-volatile memory device.

SUMMARY OF THE INVENTION

The invention is divided into two parts. The first part of the invention discloses a method for simultaneously fabricating field-oxide isolation and floating gate of non-volatile semiconductor memory devices having high coupling ratio and embedded double-sides erase cathodes. The field isolation of the invention not only eliminates the field-implant encroachment and the bird's beak extension into the active regions of minimum feature size designated for implementing non-volatile semiconductor memory device array but also reduces the isolation area, which accomplishes the first-step requirement for high-density non-volatile semiconductor memory implementation. Moreover, the lithographic masking step is reduced because the floating gate having the embedded double-sides erase cathodes and high coupling ratio is incorporated into the field isolation masking structure of the invention, resulting in the increasing throughput of manufacturing.

The second part of the invention discloses a method for fabricating scalable split-gate non-volatile semiconductor memory devices on the isolated structure disclosed in the first part of the invention. The scalable split-gate non-volatile semiconductor memory device is fabricated by the spacer formation technique without the conventional lithographic limitation, in which the floating-gate transistor and the control-gate transistor can be separately tailored to have a channel length much smaller than the minimum feature size of technology used. Therefore, the overall channel length of the fabricated split-gate non-volatile semiconductor memory device can be smaller than the minimum feature size of technology used and the major disadvantages of the conventional split-gate non-volatile semiconductor memory devices are removed. The self-aligned silicidation (SALICIDE) technique is applied to the control gate, the source/the common buried source, and the drain/the common buried drain of scalable split-gate non-volatile semiconductor memory devices; and to the gate, the source and the drain of peripheral MOS devices. Moreover, the self-aligned contacts are accomplished by forming the silicon-nitride spacers on the sidewalls of devices. As a result, the scalable split-gate non-volatile semiconductor memory device of the invention and the disclosed integration technology can be used to implement high-density and high-speed non-volatile memory system for mass storage applications.

DETAILED DESCRIPTION OF THE PREFERRED EMBODIMENTS

Figure 1:
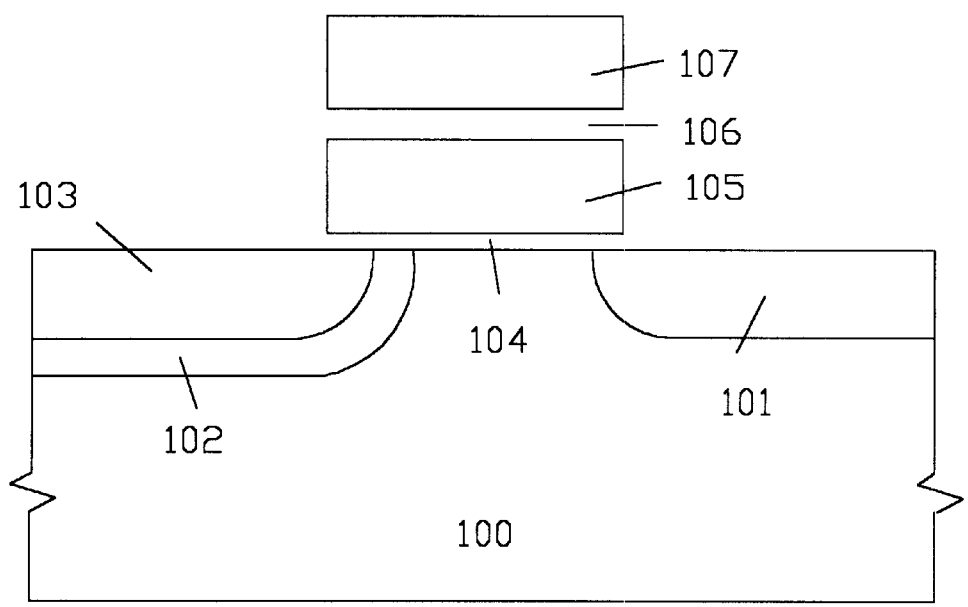
FIG. 1 shows a partial cross-sectional view of a conventional stack-gate non-volatile semiconductor memory device.
Figure 2:
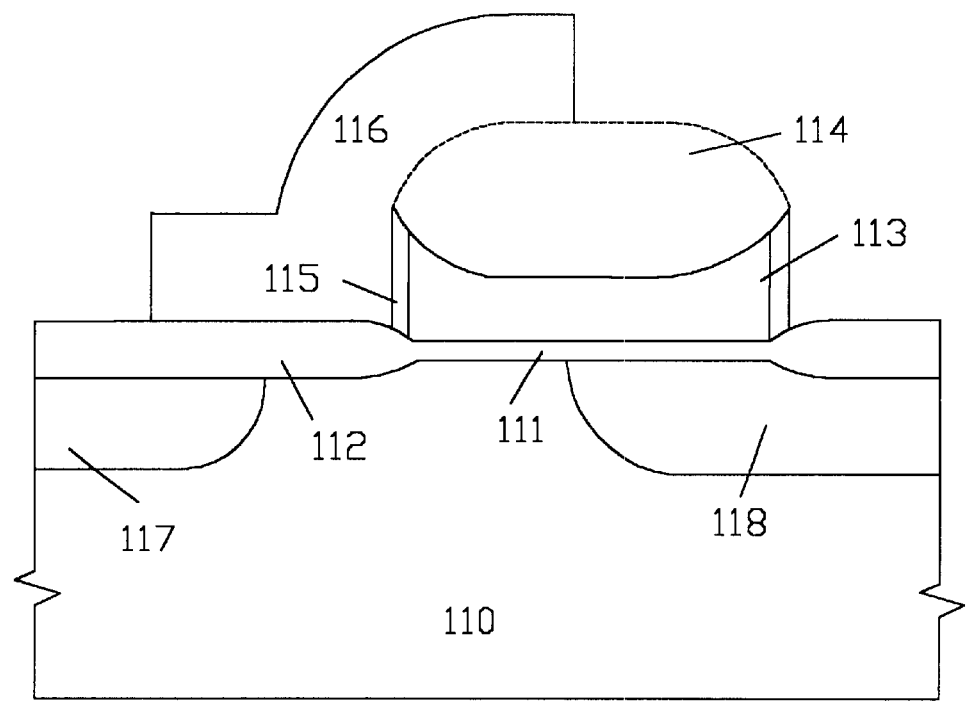
FIG. 2 shows a partial cross-sectional view of a conventional split-gate non-volatile seminductor memory device.
Figure 3:
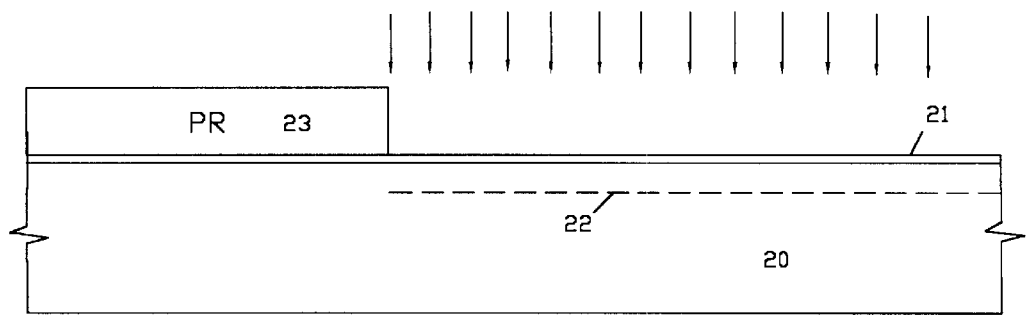
FIGS. 3 through 8 show the schematic cross-sectional views of the process and the structure of the present invention for simultaneously fabricating field-oxide isolation and floating gate of non-volatile semiconductor memory devices having high coupling ratio and embedded double-sides erase cathode
Figure 4:
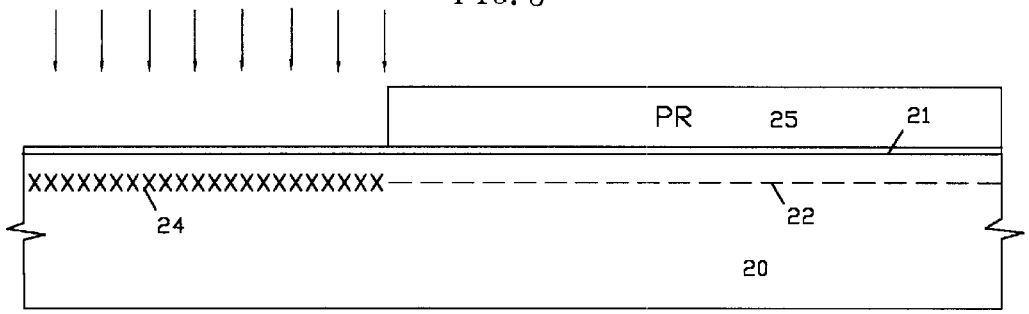

Referring now to FIGS. 3 through 8 there is shown a first embodiment of the present invention. A P-doped (100) monocrystalline-silicon substrate 20 is used. The substrate 20 is first cleaned by solvent and a pad oxide 21 is thermally grown to have a thickness of between about 200 to 300 Angstroms at 850° C. in an oxygen and steam ambient. The retrograde-well implant 22 to form p-well 22a is performed by the photoresist masking 23, as shown in FIG. 3, and the retrograde-well implant 24 to form n-well 24a is performed by the photoresist masking 25 using the reverse tone, as shown in FIG. 4. The pad oxide 21 is removed by buffered hydrofluoric acid (HF) after stripping the masking photoresist 25.

A first silicon-oxide layer 26 is thermally grown to have a thickness of between about 85 to 110 Angstroms at 850° C. in a dry oxygen ambient, a first polycrystalline-silicon layer 27 of between about 1000 to 2000 Angstroms in thickness is deposited by low-pressure chemical-vapor-deposition (LPCVD) at a temperature of between about 550° C. to 630° C. using silane as the silicon source. A silicon oxide-silicon nitride-silicon oxide (ONO) layer 28 of between about 150 to 220 Angstroms in equivalent oxide thickness is formed by first thermally growing a polycrystalline-silicon oxide layer, then depositing a LPCVD silicon-nitride layer and oxidizing the LPCVD silicon-nitride layer. A first masking silicon-nitride layer 29 of between about 500 to 1000 Angstroms in thickness is deposited by low-pressure chemical-vapor-deposition at a temperature of 720° C. using dichlorosilane and ammonia as the source of silicon and nitrogen. A first masking silicon-oxide layer 30 of between about 500 and 1000 Angstroms in thickness is deposited by low-pressure chemical-vapor-deposition at a temperature of 750° C. using tetraethoxysilane decomposition. The completed multilayer oxidation masking structure is shown in FIG. 5.

Figure 5:
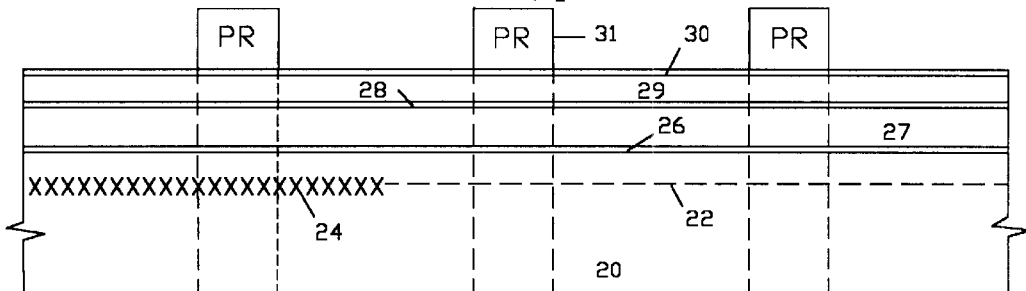
Figure 6:
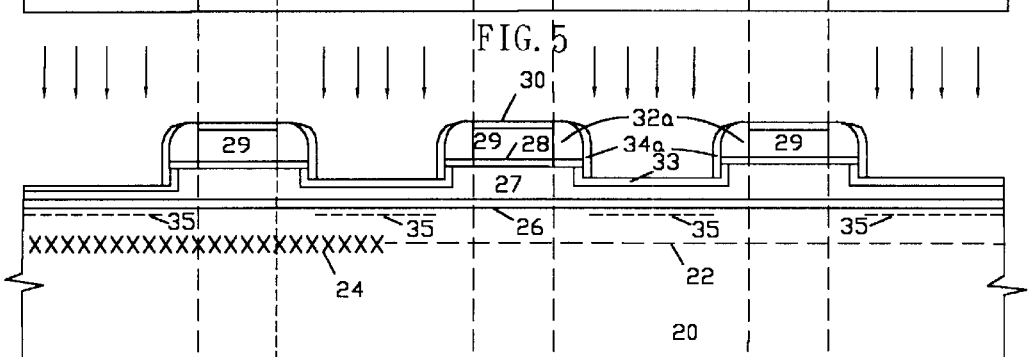

The multilayer oxidation masking structure is patterned by the conventional photoresist masking 31 as shown in FIG. 5 to define the active regions of devices and is anisotropically etched to remove the first masking silicon-oxide layer 30 and the first masking silicon-nitride layer 29. After stripping the masking photoresist 31, a first conformable silicon-nitride layer of between about 1000 to 2000 Angstroms in thickness is deposited by low-pressure chemical-vapor-deposition at 750° C. using tetraethoxysilane and ammonia reaction and is anisotropically etched to form the first silicon-nitride spacer 32 followed by anisotropically etching in a self-aligned manner the ONO layer 28 and the partial first polycrystalline-silicon layer 27. The thickness of the partial first polycrystalline-silicon layer etched is between about 500 to 1000 Angstroms and is used to form the embedded cathode for back-side erased non-volatile semiconductor memory devices and is also used to form the extended first polycrystalline-silicon region for preventing the field doping encroachment and reducing the bird's beak extension into the active regions of semiconductor devices and non-volatile semiconductor memory devices. A second silicon- oxide layer 33 of between about 150 to 220 Angstroms in thickness is thermally grown on the exposed first polycrystalline-silicon layer at 850° C. in a dry oxygen ambient, which is acted as the tunneling-oxide layer for the embedded polycrystalline-silicon cathodes. A second conformable silicon-nitride layer of between about 200 to 400 Angstroms in thickness is deposited by tetraethoxysilane and ammonia reaction at 750° C. followed by anisotropically etching the deposited second conformable silicon-nitride layer to form the second silicon-nitride spacer 34 over the sidewalls of the oxidized first polycrystalline-silicon layer. The implant of boron impurities is performed to form the channel stop 35 in the semiconductor regions and the dose of boron implant is between about $10^{13}$ to $10^{14}$ Atoms/cm$^2$. This completes the multilayer oxidation masking structure as shown in FIG. 6.

Figure 7:
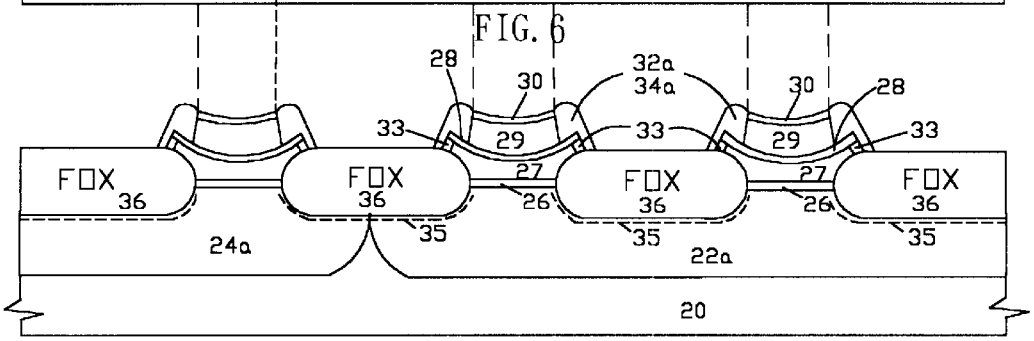

The field oxidation is performed in a oxygen and steam ambient at a temperature of between 950° C. to 1050° C. to form the Field-OXide isolation layer 36 as marked by FOX. The final structure of the field-oxide isolation process is shown in FIG. 7. The results of the as-described oxidation masking structure are that not only higher coupling ratio and embedded double-sides erase cathodes are simultaneously obtained by the extended first polycrystalline-silicon layer but also the field-implant encroachment and the bird's beak extension into the active regions of devices are reduced by the extended first polycrystalline-silicon layer.

Figure 8:
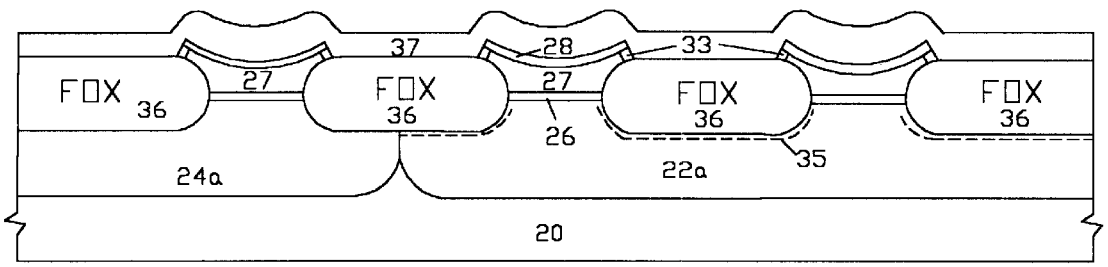
Figure 9:
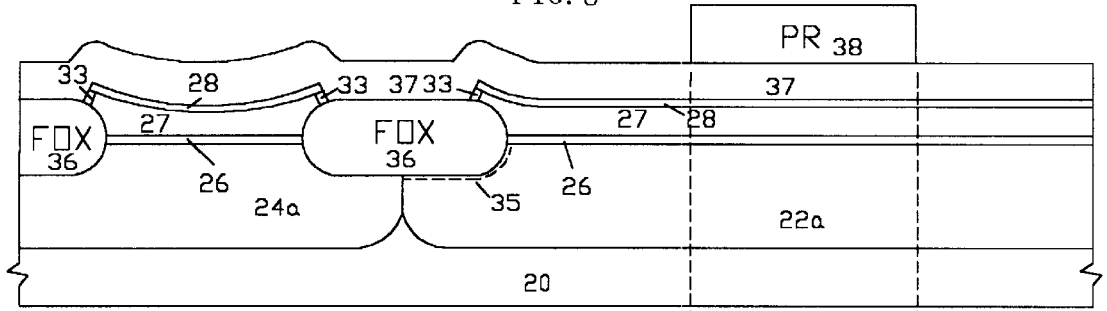
FIGS. 9 through 21 show the schematic cross-sectional views of the process and the structure of the present invention for simultaneously fabricating the scalable split-gate non-volatile semiconductor memory devices and peripheral MOS devices.

The remained first masking silicon-nitride layer and first and second silicon-nitride spacers of the oxidation masking structure as shown in FIG. 7 are now removed by hot phosphoric acid and the first masking silicon-oxide layer over the remained first masking silicon-nitride layer is lifted off. A second masking silicon-nitride layer 37 of between about 1000 to 2000 Angstroms in thickness is deposited by low-pressure chemical-vapor deposition using dichlorosilane and ammonia reaction at 720° C. The cross-sectional view of the width direction is shown in FIG. 8 and that of the channel-length direction is shown in FIG. 9.

Referring now to FIG. 9 through FIG. 21 there is shown a second embodiment of the present invention. The conventional photolithographic technique is used to define the virtual length of non-volatile semiconductor memory devices as shown in FIG. 9, where the virtual length is equal to two device-channel lengths plus one common-source diffusion width. The patterned photoresist 38 is used as the mask to anisotropically etch the second masking silicon-nitride layer 37, the ONO layer 28 and the first polycrystalline-silicon layer 27, and the photoresist masking 38 is then removed. Note that this process completely removes the stack structure consisting of the second masking silicon-nitride layer/the ONO layer/the first polycrystalline-silicon layer over the semiconductor regions designated for fabricating other semiconductor devices.

Figure 10:
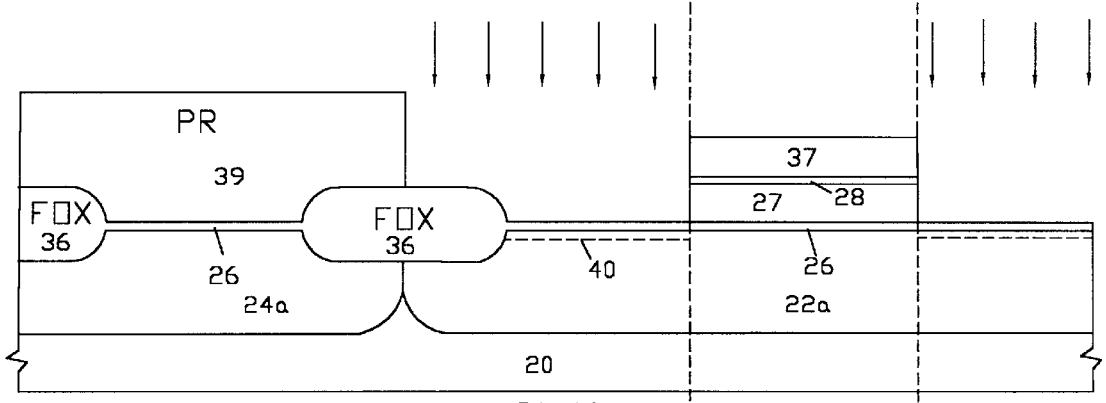

Using the photoresist masking 39, the implants of acceptor impurities 40 across the first silicon-oxide layer 26 into the semiconductor regions of the p-wells are performed to adjust the threshold-voltage and the punch-through voltage of n-channel MOS devices and control-gate devices of non-volatile semiconductor memory devices, as shown in FIG. 10. Using the reverse-tone photoresist masking, the implants of acceptor and donor impurities 41 across the first silicon-oxide layer 26 into the semiconductor regions of the n-wells are performed to adjust the threshold-voltage and the punch-through voltage of p-channel MOS devices. Stripping the reverse-tone photoresist, the first silicon-oxide layer 26 is removed by a wet-chemical dip etching using dilute hydrofluoric acid or buffered hydrofluoric acid.

Figure 11:
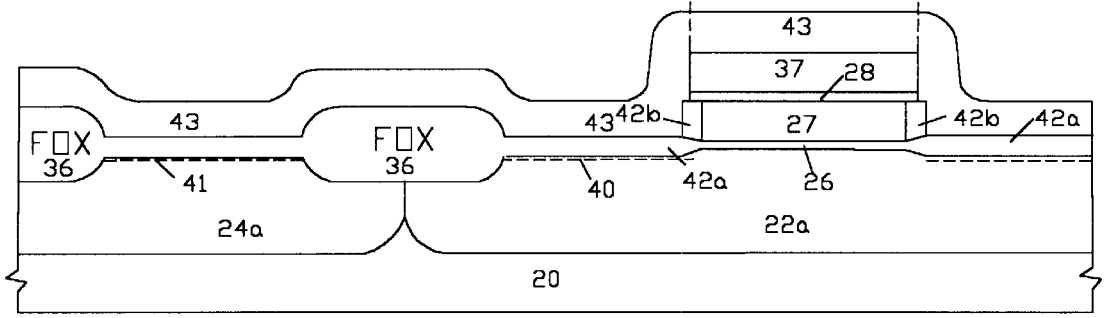
Figure 12:
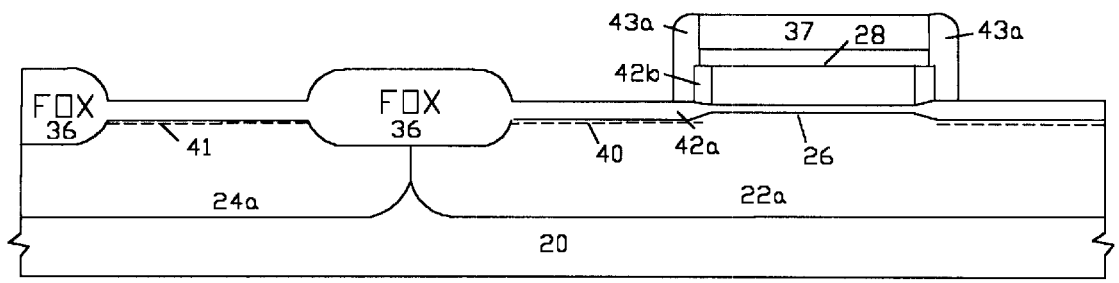
Figure 13:
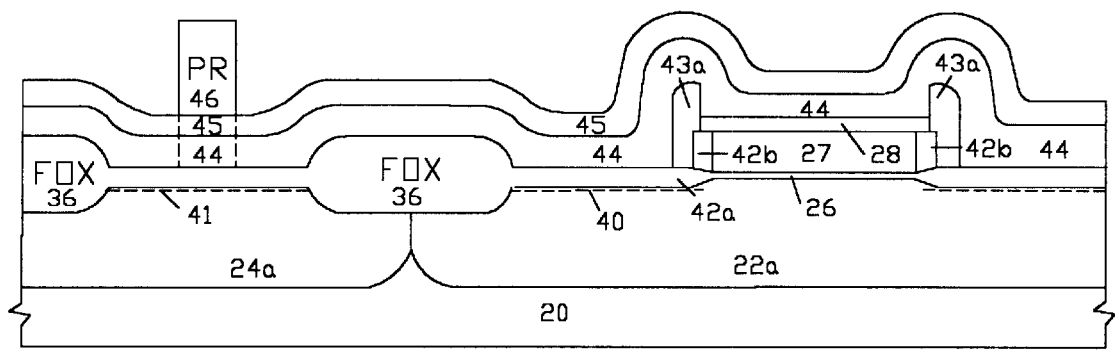
Figure 14:
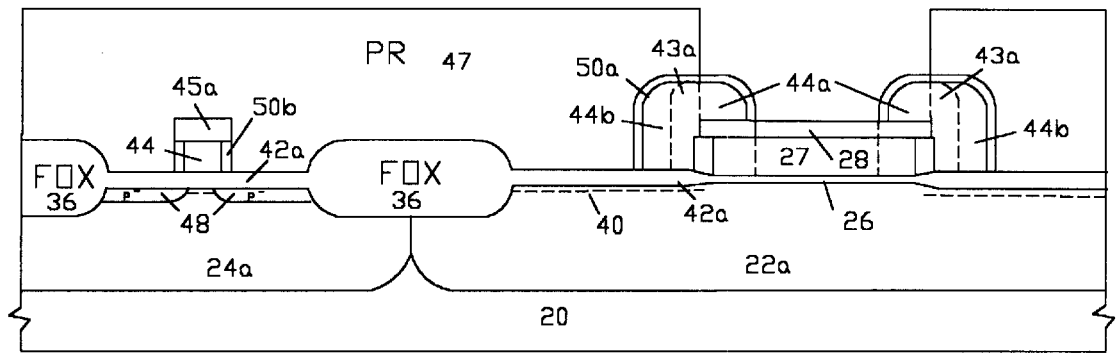

A second silicon-oxide layer of between about 200 to 400 Angstroms in thickness is thermally grown over the exposed semiconductor regions 42a and the exposed sidewalls of the polycrystalline-silicon layer 42b at a temperature of between about 850° C. to 1050° C. in a dry oxygen ambient. A second conformable in-situ doped polycrystalline-silicon layer 43 of between about 500 to 1500 Angstroms in thickness is deposited by low-pressure chemical-vapor-deposition using silane decomposition at a temperature of between about 600° C. to 650° C., as shown in FIG. 11. The second conformable polycrystalline-silicon layer is then anistropically etched to form the first polycrystalline-silicon spacers 43a, as shown in FIG. 12. The second masking silicon-nitride layer 37 is removed by hot phosphoric acid. Again, a third conformable in-situ doped polycrystalline-silicon layer 44 of between about 500 to 2000 Angstroms in thickness is deposited by low-pressure chemical-vapor-deposition using silane decomposition at a temperature of between about 600° C. to 650° C. A third masking silicon-nitride layer 45 of between about 500 to 1000 Angstroms in thickness is then deposited by low-pressure chemical-vapor-deposition using dichlorosilane and ammonia reaction at 720° C. The photoresist 46 is patterned to define the channel lengths of n-channel and p-channel MOS devices, as shown in FIG. 13, followed by etching the third masking silicon-nitride layer 45 using dry etching and then anistropically etching the third polycrystalline-silicon layer 44 to form the second polycrystalline-silicon spacers 44a and 44b for non-volatile semiconductor memory devices, as shown in FIG. 14. Note that the width of the polycrystalline-silicon spacer is mainly controlled by the thickness of the deposited conformable polycrystalline-silicon layer. Therefore, the channel length of floating-gate devices and the channel length of control-gate devices are scalable through the thickness control of the deposited conformable polycrystalline-silicon layer.

Figure 15:
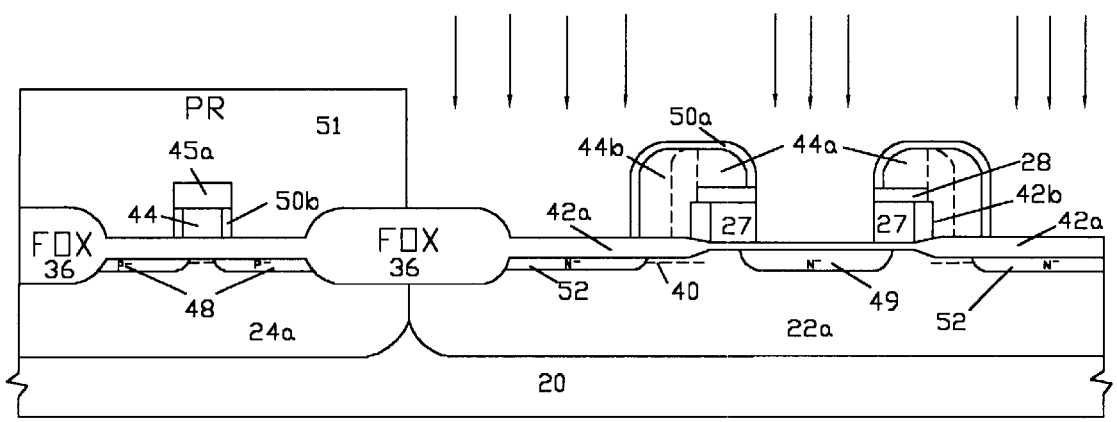

The self-aligned implant of boron impurities 48 for lightly-doped p-channel source and drain is performed by the photoresist masking followed by stripping the photoresist. The oxidation of the exposed third polycrystalline-silicon gate and spacers is performed in a dry oxygen or steam ambient at a temperature of between about 900° C. to 1050° C. to have a thickness of between about 200 to 300 Angstroms. The ONO layer 28 and the first polycrystalline-silicon layer 27 are sequentially etched by reactive-ion etching with a non-critical photoresist masking 47, as shown in FIG. 14, and the photoresist is stripped by the conventional method. Using the photoresist masking 51, the implant of phosphorous impurities for lightly-doped source 49 and drain 52 of non-volatile semiconductor memory devices and n-channel MOS devices is performed, as shown in FIG. 15, and the dose of lightly-doped implant is between about $10^{13}$ to $10^{14}$ Atoms/cm$^2$ After stripping the masking photoresist 51, the third masking silicon-nitride layer 45a on the third polycrystalline-silicon layer 44 of n- and p-channel MOS devices is removed by dry etching followed by oxidizing the exposed third polycrystalline-silicon layer to form polycrystalline-silicon oxide layer 53a. The polycrystalline-silicon oxide layer 53a is grown in a dry oxygen ambient at a temperature of between about 850° C. to 1050° C. and the thickness is between about 100 to 150 Angstroms.

Figure 16:
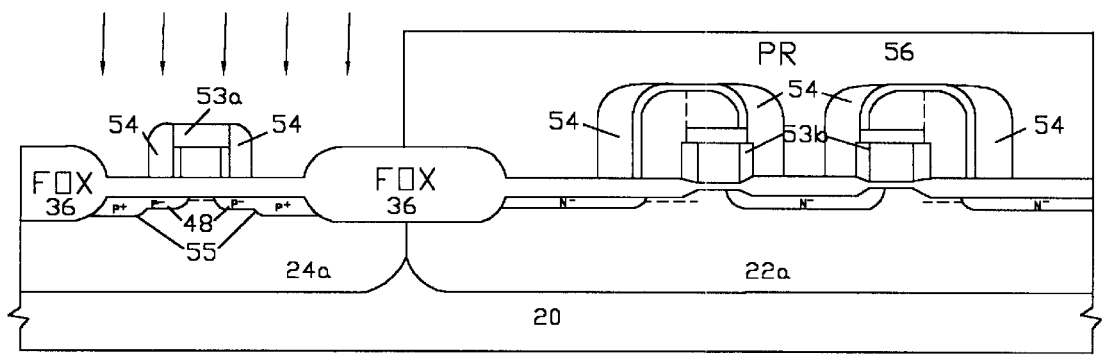
Figure 17:
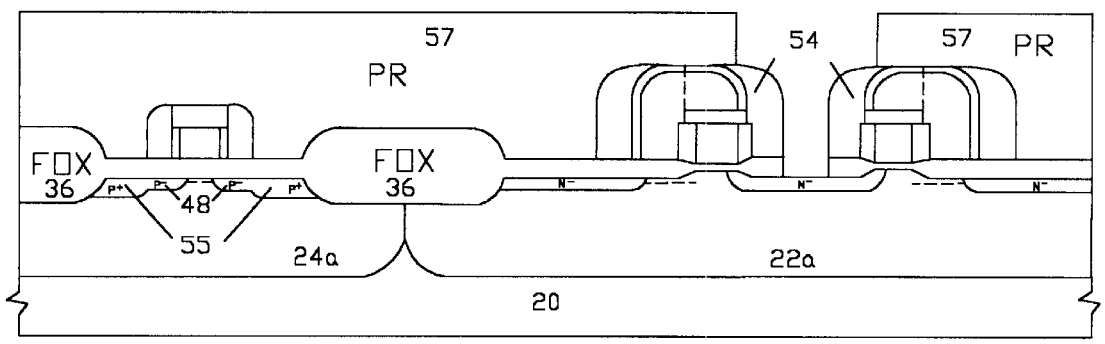

A third conformable silicon-nitride layer is deposited by low-pressure chemical-vapor-deposition using tetraethoxysilane and ammonia reaction at 750° C. and is anisotropically etched to form the third silicon-nitride spacers 54 for non-volatile semiconductor memory devices and n- and p-channel MOS devices. The thickness of the deposited third silicon-nitride layer is between about 500 to 1000 Angstroms. The implant of boron impurities for heavily-doped p-channel source and drain 55 is performed by using the photoresist masking 56, as shown in FIG. 16, and the dose of the heavily-doped implant is between about $10^{15}$ to $5\times10^{15}$ Atoms/cm$^2$.

Figure 18:
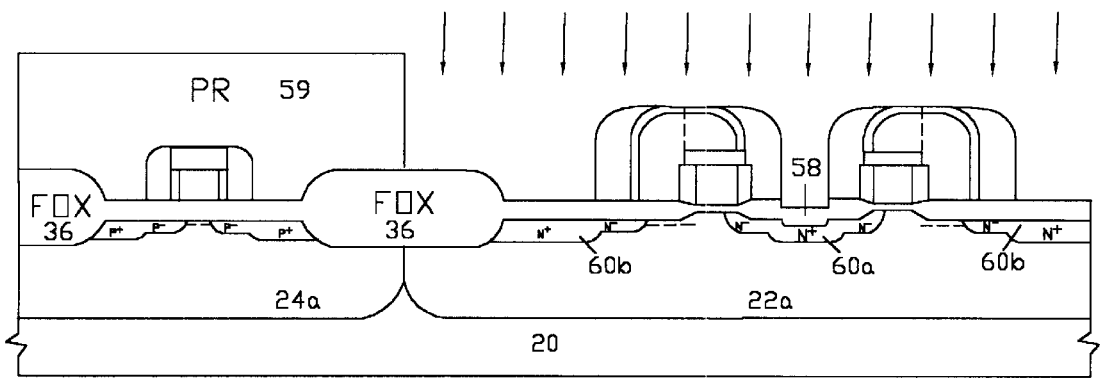

Using the photoresist masking 57, the field-oxide layer 36 and the silicon-oxide layer over the lightly-doped source of non-volatile semiconductor memory devices are removed by buffered hydrofluoric acid in a self-aligned manner. After stripping the masking photoresist 57, the oxidation of the exposed semiconductor regions designated as the buried common source is performed in a dry oxygen ambient at a temperature of between 850° C. to 1050° C. to have a silicon-oxide layer 58 of between about 100 to 150 Angstroms. The implant of arsenic impurities for heavily-doped source 60a and drain 60b of non-volatile semiconductor memory devices and n-channel MOS devices is performed by using the photoresist masking 59, as shown in FIG. 18, and the dose of the heavily-doped implant is between about $10^{15}$ to $5\times10^{15}$ Atoms/cm$^2$. After stripping the masking photoresist 59, a thermal cycle used to activate the implanted impurities and to eliminate the implant-induced defects is performed in a nitrogen ambient using furnace or rapid-thermal anneal (RTA) system and the annealing temperature is between about 900° C. to 1000° C.

The silicon-oxide layers over the heavily-doped source and drain regions and the polycrystalline-silicon oxide layers over the third polycrystalline-silicon gates of non-volatile semiconductor memory devices and MOS devices are removed by a wet chemical dip in dilute hydrofluoric acid or buffered hydrofluoric acid or by anisotropic dry etching.

Figure 19:
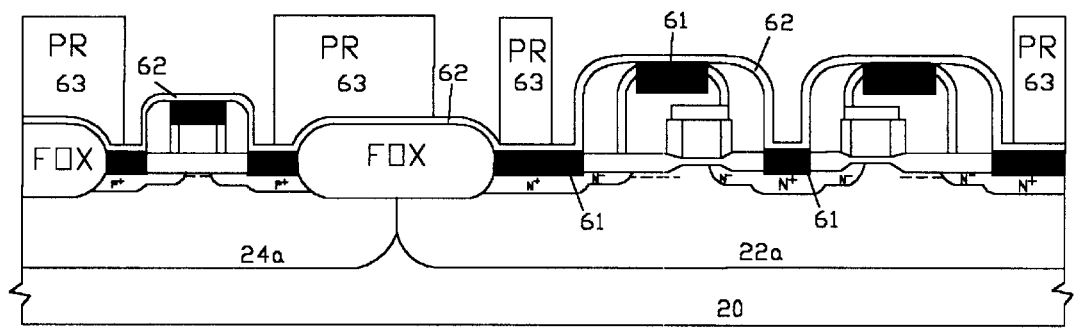
Figure 20:
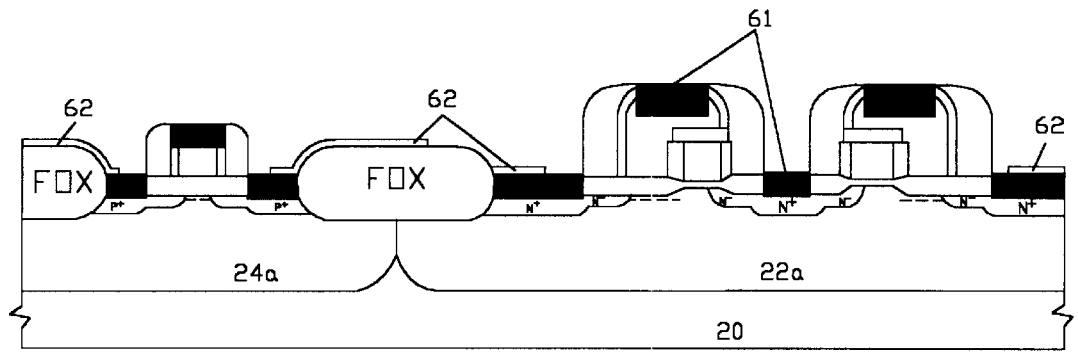

The titanium metal film is deposited by sputtering and the thickness is between about 500 to 1000 Angstroms. The rapid thermal annealing at 600° C. is performed in a nitrogen ambient to form the titanium-disilicide (TiSi$_2$) layer 61 over monocrystalline-and polycrystalline-silicon surfaces and the titanium- nitride (TiN) layer 62 over all surfaces, as shown in FIG. 19. Using the photoresist masking 63, the titanium-nitride layer is patterned and etched by a NH$_4$OH:H$_2$O$_2$:H$_2$O (1:1:5) solution, and the masking photoresist is stripped. The completed structure is heated in a furnace in an argon ambient to reduce the resistivity of the titanium-nitride and titanium-disilicide layers, as shown in FIG. 20.

Figure 21:
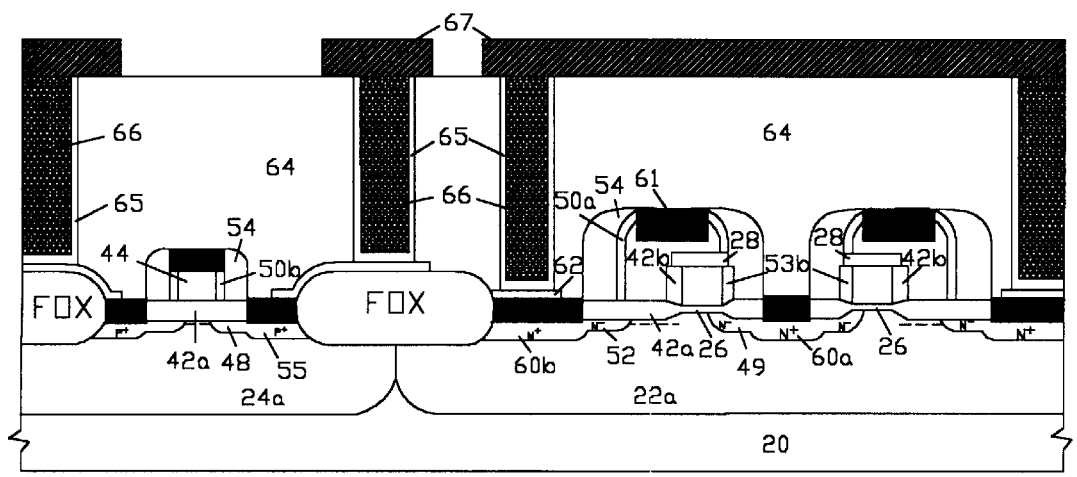

A thick dielectric layer 64 such as borophosphosilicate glass (BPSG) is deposited by plasma-enhanced chemical-vapor-deposition (PECVD) followed by chemical-mechanical-polishing (CMP) to planarize the whole structure surface. Using the photoresist masking, the contact holes are patterned and etched to remove the borophosphosilicate glass followed by stripping the masking photoresist. The reflow of the borophosphosilicate glass is performed at 850° C. to round up the corners of the etched glass. A thin titanium-nitride layer 65 of between about 100 to 200 Angstroms is deposited by sputtering or chemical-vapor-deposition. This layer is acted as the barrier-metal layer between the upper metal layer and the lower metal layer which connects to the active devices and also provides good adhesion to the silicon-oxide glass and other underlying materials present in the structure. The tungsten layer 66 acted as the known plugs is deposited by low-pressure chemical-vapor-deposition using tungsten-fluoride reduction in hydrogen at a temperature of between 250° C. to 500° C. to fill the contact holes. Again, the chemical-mechanical-polishing (CMP) is applied to planarize the structure surface by removing the tungsten and titanium-nitride layers. The M1 metal layer 67 of between about 5000 to 10000 Angstroms in thickness is deposited by sputtering followed by patterning the M1 metal layer using the photoresist masking to form the interconnect of semiconductor devices, as shown in FIG. 21. The multilevel interconnect can be accomplished by depositing an intermediate dielectric layer followed by chemical-mechanical-polishing, vias etching, barrier metal and plug depositions, CMP, metallization and patterning, and followed by repeating the above processes. At last, the passivation layer is deposited and then the bonding pads are patterned and etched. The titanium metal used in the above description can be replaced by other well-known refractory metals such as tantalum, cobalt and molybdenum etc.; the intermediate dielectric layer can be CVD silicon-oxide or other low-K dielectric layer; the interconnect metal can be aluminum or aluminum alloy or copper.

The embodiments of FIGS. 12 through 21 show that the scalable control-gate length of non-volatile semiconductor memory devices can be easily obtained by just controlling the thicknesses of the deposited conformable polycrystalline-silicon layers despite of the conventional limitation due to the minimum feature size of each lithographic step. Moreover, the self-aligned silicidation technique is used to reduce not only the interconnect resistance of the control-gate but also the resistance of the common buried source for non-volatile semiconductor memory devices.

The embodiments of FIGS. 3 through 21 used a p-substrate and a boron-doped channel stop region. It should be well understood by those skilled in the art that the opposite doping type may also be used. Furthermore, the non-volatile semiconductor memory devices may also be fabricated in n-well to form p-channel non-volatile semiconductor memory devices by taking the advantages of the present invention.

While the invention has been particularly shown and described with reference to the preferred embodiments thereof, it will be understood by those skilled in the art that various changes in form and details may be made without departing from the true spirit and scope of the invention.

What is claimed is:

1. A method for simultaneously fabricating field-oxide isolation and floating gate of non-volatile semiconductor memory devices with high coupling ratio and embedded double-sides erase cathodes comprising:

providing a multilayer oxidation masking structure of a first silicon-oxide layer, a first polycrystalline-silicon layer, a silicon oxide-silicon nitride-silicon oxide (ONO) layer, a first masking siliconnitride layer and a first masking silicon-oxide layer;

patterning said multilayer oxidation masking structure by selectively removing said first masking silicon-oxide layer and said first masking silicon-nitride layer;

forming first silicon-nitride sidewall spacers on the exposed sidewalls of said patterned oxidation masking structure by depositing a first conformable silicon-nitride layer over the patterned oxidation masking structure and anisotropically etching said first conformable silicon-nitride layer, wherein the width of said first silicon-nitride sidewall spacer is determined by the thickness of said first conformable silicon-nitride layer;

etching said patterned oxidation masking structure in a self-aligned manner by removing said silicon oxide-silicon nitride-silicon oxide (ONO) layer and a portion of the thickness of said first polycrystalline-silicon layer, wherein said first polycrystalline-silicon layer is acted as the buffer layer for stress relief during field oxidation and said etching removes a portion of said first polycrystalline-silicon layer;

oxidizing the exposed portion of said remained first polycrystallinesilicon layer to grow a second silicon-oxide layer, wherein said second silicon-oxide layer becomes the tunneling-oxide layer of the embedded double-sides erase cathodes for back-side-erased non-volatile semiconductor memory devices;

forming the second sidewall spacers on the oxidized sidewall of said partially etched first polycrystalline-silicon layer by depositing a second conformable silicon-nitride layer over said oxidized masking structure followed by anisotropically etching said second conformable silicon-nitride layer, wherein the formed second silicon-nitride spacer is used to shield the extended first polycrystalline-silicon from oxidation during field oxidation and also to reduce the bird's peak extension into the active regions of non-volatile semiconductor memory devices;

implanting doping impurities into the designated semiconductor regions in a self-aligned manner to form the channel stop; and performing the conventional field oxidation step to form the field-oxide isolation structure whereby said channel stop is confined under said field oxide grown, wherein said field oxidation is accomplished in an oxygen and steam ambient.

2. The method of claim 1 and further comprising the removal of said remained first masking silicon-nitride layer and first and second silicon-nitride spacers by wet chemical etching followed by the deposition of a second masking silicon-nitride layer, wherein said first making silicon-oxide layer over said remained first masking silicon-nitride layer is lifted off.

3. The method of claim 2 and further comprising the patterning of said first polycrystalline-silicon layer of non-volatile semiconductor memory devices and the simultaneous removal of said multilayer oxidation masking structure over the regions wherein the thicker gate-oxide semiconductor devices are intended to fabricate, wherein said first polycrystalline-silicon layer of non-volatile semiconductor memory devices is defined by using the photoresist masking followed by etching said second masking silicon-nitride layer, said silicon oxide-silicon nitride-silicon oxide (ONO) layer, and said first polycrystalline-silicon layer.

4. The method of claim 3 and further comprising the implants of different doping impurity types and doses into the semiconductor regions across the first silicon-oxide layer for adjusting the threshold-voltage and forming the punch-through stop of semiconductor devices having said third silicon-oxide layer, wherein said implants of different doping impurity types and doses are performed by using different photoresist maskings.

5. The method of claim 4 and further comprising the removal of said first silicon-oxide layer and the oxidation of the exposed semiconductor regions and the exposed sidewalls of said first polycrystalline-silicon layer to have a third silicon-oxide layer, wherein said first silicon-oxide layer is removed by the wet chemical etching and said third silicon-oxide layer grown over said semiconductor regions is used as the gate-oxide layer of semiconductor devices.

6. The method of claim 5 wherein said third silicon-oxide layer is acted as the gate oxide layer of semiconductor devices and is between 200 to 400 Angstroms in thickness.

7. The method of claim 5 and further comprising the deposition of a second polycrystalline-silicon layer followed by anisotropically etching said second polycrystalline-silicon layer to form the first polycrystalline-silicon spacers for non-volatile semiconductor memory devices.

8. The method of claim 7 wherein the thickness of said second polycrystalline-silicon layer is between about 300 to 1500 Angstroms and is in-situ doped with a doping impurity concentration of between about $10^{18}$ to $5\times10^{19}$ Atoms/cm$^3$.

9. The method of claim 7 and further comprising the removal of the exposed second masking silicon-nitride layer over non-volatile semiconductor memory devices by means of wet chemical etching.

10. The method of claim 9 and further comprising the deposition of a third polycrystalline-silicon layer followed by the deposition of a third masking silicon-nitride layer and the implant of high-dose impurities into said third polycrystalline-silicon layer, wherein said third polycrystalline-silicon layer is acted as the gate and the interconnect metal of semiconductor devices, and said implant of high-dose impurities is between about $10^{15}$ to $5\times10^{15}$ Atoms/cm$^2$.

11. The method of claim 10 wherein said third polycrystalline-silicon layer is between about 500 to 1000 Angstroms in thickness and is in-situ doped with a doping concentration of between about $10^{18}$ to $5\times10^{19}$ Atoms/cm$^3$ or is implanted with a dose of between about $10^{15}$ to $5\times10^{15}$ Atoms/cm$^2$.

12. The method of claim 10 and further comprising the patterning of the gate lengths of semiconductor devices by the photoresist masking followed by etching said third silicon-nitride layer and anisotiopically etching said third polycrystalline-silicon layer to form the second polycrystalline-silicon spacers on the sidewalls of non-volatile semiconductor memory devices.

13. The method of claim 12 and further comprising the implant of doping impurities to form lightly-doped source and dram diffusion islands of semiconductor devices by using a photoresist masking, wherein the doping type of said lightly-doped source and drain diffusion islands is different from that of non-volatile semiconductor memory devices and the dose of lightly-doped impurities is between about $10^{13}$ to $10^{14}$ Atoms/cm$^2$.

14. The method of claim 13 wherein the doping type of said implant for source and drain diffusion islands is p-type and that of non-volatile semiconductor memory devices is n-type.

15. The method of claim 13 and further comprising the oxidation of said exposed third polycrystalline-silicon layer to form a polycrystalline silicon-oxide layer.

16. The method of claim 15 and further comprising the etching of the floating-gate length of non-volatile semiconductor memory devices in a self-aligned manner by removing said silicon oxide-silicon nitride-silicon oxide (ONO) layer and said first polycrystalline-silicon layer, wherein a non-critical photoresist masking is used to protect the non-etching area from etching.

17. The method of claim 16 and further comprising the implant of doping impurities to form lightly-doped source and drain diffusion islands for non-volatile semiconductor memory devices and semiconductor devices of the same source and drain doping type by using the photoresist masking, wherein the dose of said implant of doping impurities is between about $10^{13}$ to $10^{14}$ Atoms/cm$^2$ and said doping impurity is phosphorous.

18. The method of claim 17 and further comprising the removal of the third masking silicon-nitride layer over the third polycrystalline-silicon layer of semiconductor devices by using dry etch and the oxidation of the exposed first and third polycrystalline-silicon layers.

19. The method of claim 18 and further comprising the deposition of a third conformable silicon-nitride layer followed by anisotropically etching said third conformable silicon-nitride layer to form the third silicon-nitride spacers for non-volatile semiconductor memory devices and semiconductor devices.

20. The method of claim 19 and further comprising the implant of high-dose impurities into the semiconductor regions to form the heavily-doped source and drain diffusion islands of semiconductor devices by using the photoresist masking, wherein the doping type of said heavily-doped source and drain diffusion islands is different from that of non-volatile semiconductor memory devices and the dose of the heavily-doped impurities is between about $10^{15}$ to $5\times10^{15}$ Atoms/cm$^2$.

21. The method of claim 20 and further comprising the self-aligned etching of the field-oxide layer and the silicon-oxide layer over the source diffusion region of non-volatile semiconductor memory devices by using the photoresist masking followed by the oxidation of the exposed semiconductor region after stripping the masking photoresist.

22. The method of claim 21 and further comprising the implant of high-dose impurities into the semiconductor regions to form the common buried source diffusion interconnect and the drain diffusion islands of non-volatile semiconductor memory devices and the source and drain diffusion islands of semiconductor devices with the same doping type using the photoresist masking.

23. The method of claim 22 and further comprising the self-aligned etching of all silicon-oxide layers over the source and drain diffusion regions and the third polycrystalline-silicon layers over the gate regions.

24. The method of claim 23 and further comprising the deposition of titanium metal followed by a thermal cycle in a nitrogen ambient to form $TiSi_2$ over the source and drain diffusion islands and said third polycrystalline-silicon of non-volatile semiconductor memory devices and semiconductor devices, wherein the TiN layer formed over the structure is patterned by the photoresist masking followed by etching using $NH_4OH:H_2O_2:H_2O$ (1:1:5).

25. The method of claim 24 wherein said titanium metal is replaced by other refractory metal such as tantalum, cobalt or molybdenum etc.

26. The method of claim 24 and further comprising the deposition of a thick dielectric layer over all devices followed by chemical-mechanical polishing (CMP) to have a smooth surface morphology, wherein said dielectric layer is made of CVD oxide or borophosphosilicate glass (BPSG).

27. The method of claim 26 and further comprising the etching of contacts followed by metallization and patterning, wherein metallization includes the depositions of barrier metal and plug metal followed by chemical-mechanical polishing (CMP) and the deposition of a metal layer followed by patterning said metal layer, wherein said metal is made of aluminum or aluminum alloy or copper, said barrier metal is made of TiN, and said plug metal is made of tungsten or aluminum.

28. The method of claim 27 wherein the patterning of M1 metal is to form the bit-line which connects the drains of a series of non-volatile semiconductor memory devices for high-density and high-speed NOR-type flash memory array implementation.

29. The method of claim 27 and further comprising the deposition of intermediate dielectric layer followed by chemical-mechanical polishing (CMP) and vias etching using the photoresist masking for second-level interconnect M2.

30. The method of claim 29 wherein the intermediate dielectric layer is made of silicon-oxide or other low dielectric-constant insulators.

31. The method of claim 29 and further comprising the repeating processes for multi-levels interconnect.

32. The method of claim, 31 and further comprising the deposition of a thick passivation layer followed by patterning said thick passivation layer to expose the bonding pads.

33. The method of claim 1 wherein said first silicon-oxide layer is acted as the tunneling-oxide layer for hot-electron injection in non-volatile semiconductor memory devices and is between about 85 to 110 Angstroms in thickness; said second silicon-oxide layer is acted as the tunneling-oxide layer of embedded double-sides erase cathodes and is between about 150 to 220 Angstroms in thickness.

34. The method of claim 1 wherein said ONO layer is between about 150 to 220 Angstroms in equivalent silicon-oxide thickness.

35. The method of claim 1 wherein the thickness of said first masking silicon-oxide layer is between about 500 to 1000 Angstroms; the thickness of said first masking silicon-nitride layer is between about 500 to 1000 Angstroms.

36. The method of claim 1 wherein said first conformable silicon-nitride layer is between about 1000 to 2000 Angstroms in thickness; said second conformable silicon-nitride layer is between about 200 to 400 Angstroms in thickness.

37. The method of claim 1 wherein said first polycrystalline-silicon layer is acted as the floating gate of non-volatile semiconductor memory devices and is in-situ doped and/or implanted with doping concentration of between about $10^{19}$ to $10^{20}$ Atoms/cm$^3$ and is between about 1000 to 2000 Angstroms in thickness.

38. The method of claim 1 wherein said etching removes said first polycrystalline-silicon layer of a thickness of between about 500 to 1500 Angstroms.

39. The method of claim 1 wherein said first silicon-nitride spacer is used to define the extended length of the etched first polycrystalline-silicon layer and is further used to determine the coupling ratio of non-volatile semiconductor memory devices and also to prevent the extension of bird's beak length and the field doping encroachment into the active regions of all semiconductor devices fabricated therein.

40. The method of claim 1 wherein said semiconductor substrate is p-type with retrograde n-well and p-well implants performed and the non-volatile semiconductor memory devices are fabricated within p-well.

41. The method of claim 1 wherein said doping impurities to form said channel stop are boron and said doping impurities can be implanted after the full conversion of the remained first polycrystalline-silicon layer into polycrystalline -silicon oxide during field oxidation.

42. The method of claim 1 wherein said embedded double-sides erase cathodes are used to implement non-volatile semiconductor memory devices of any possible device structures.

* * * * *